(12) United States Patent
Kim et al.

(10) Patent No.: US 8,672,210 B2
(45) Date of Patent: Mar. 18, 2014

(54) CAPILLARY EXCHANGE SYSTEM OF SEMICONDUCTOR WIRE BONDING

(71) Applicant: Samsung Electronics Co., Ltd., Suwon-Si (KR)

(72) Inventors: Young Sik Kim, Cheonan-si (KR); Doo Jin Kim, Cheonan-si (KR); Sung Bok Hong, Cheonan-si (KR); Ki Taik Oh, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/728,316

(22) Filed: Dec. 27, 2012

(65) Prior Publication Data

US 2013/0221071 A1  Aug. 29, 2013

(30) Foreign Application Priority Data

Feb. 28, 2012  (KR) .......................... 10-2012-0020308

(51) Int. Cl.
*B23K 37/00* (2006.01)

(52) U.S. Cl.
USPC ......................................... 228/4.5; 228/180.5

(58) Field of Classification Search
None
See application file for complete search history.

(56) References Cited

U.S. PATENT DOCUMENTS

| 3,245,144 | A | * | 4/1966 | Kumagai et al. | ................ 29/33 P |
| 4,046,263 | A | * | 9/1977 | Cwycyshyn et al. | ...... 414/744.3 |
| 4,340,166 | A | * | 7/1982 | Bilane et al. | ................ 228/180.5 |
| 4,361,261 | A | * | 11/1982 | Elles et al. | ..................... 228/103 |
| 5,465,899 | A | | 11/1995 | Quick et al. | |
| 5,494,206 | A | * | 2/1996 | Endo | .............................. 228/102 |
| 5,566,876 | A | | 10/1996 | Nishimaki et al. | |
| 5,927,587 | A | * | 7/1999 | Koduri | ........................... 228/4.5 |
| 6,065,663 | A | * | 5/2000 | Koduri | ........................... 228/4.5 |
| 6,135,338 | A | * | 10/2000 | Kyomasu et al. | ............... 228/1.1 |
| 6,215,195 | B1 | * | 4/2001 | Koduri | ........................... 257/784 |
| 6,518,537 | B1 | * | 2/2003 | Tezawa | ........................ 219/119 |
| 6,787,764 | B2 | | 9/2004 | Park | |
| 7,402,817 | B2 | | 7/2008 | Gavrilov et al. | |
| 7,488,604 | B2 | | 2/2009 | Clark et al. | |
| 2002/0190104 | A1 | * | 12/2002 | Yoshinaga | ................. 228/112.1 |
| 2005/0092809 | A1 | * | 5/2005 | Murakami | .................... 228/2.1 |
| 2005/0173491 | A1 | | 8/2005 | Kim et al. | |
| 2006/0073074 | A1 | | 4/2006 | Winther | |

(Continued)

FOREIGN PATENT DOCUMENTS

DE  3605099 A * 10/1987
DE  202007017935 A * 4/2008

(Continued)

OTHER PUBLICATIONS

Machine translation of JP-2008-141025A (no date available).*

*Primary Examiner* — Kiley Stoner
(74) *Attorney, Agent, or Firm* — Harness, Dickey & Pierce, P.L.C.

(57) ABSTRACT

A capillary exchange system of a semiconductor wire bonding includes a wire bond unit having a chuck that includes a holding portion for holding a capillary for semiconductor wire bonding, a holding release guide unit for mechanically acting on the chuck of the wire bond unit to allow the capillary to be held by the holding portion or released from the holding portion, and a capillary exchange unit for separating the capillary from the chuck of the wire bond unit and installing a new capillary in the chuck in cooperation with the holding release guide unit.

17 Claims, 7 Drawing Sheets

(56) References Cited

U.S. PATENT DOCUMENTS

| | | |
|---|---|---|
| 2007/0181651 A1 | 8/2007 | Takahashi et al. |
| 2009/0101628 A1 * | 4/2009 | Kaeseler ............... 219/86.8 |
| 2010/0065092 A1 * | 3/2010 | Matlack et al. ........... 134/105 |
| 2012/0241415 A1 * | 9/2012 | Machan ............... 219/86.8 |

FOREIGN PATENT DOCUMENTS

| | | | | |
|---|---|---|---|---|
| JP | 7037926 | A | | 2/1995 |
| JP | 10-064939 | A | * | 3/1998 |
| JP | 2002-079381 | A | * | 3/2002 |
| JP | 2002-153973 | A | * | 5/2002 |
| JP | 2003-039175 | A | * | 2/2003 |
| JP | 2005-111537 | A | * | 4/2005 |
| JP | 2007214342 | A | | 8/2007 |
| JP | 2008516203 | A | | 5/2008 |
| JP | 2008-141025 | A | * | 6/2008 |
| JP | 2011-113983 | A | * | 6/2011 |
| JP | 2012-209601 | A | * | 10/2012 |
| JP | 2012-209602 | A | * | 10/2012 |
| KR | 19990023832 | U | | 7/1999 |
| KR | 20050080282 | A | | 8/2005 |
| KR | 20090011422 | U | | 11/2009 |
| KR | 12-16192 | A | * | 12/2012 |

* cited by examiner

CAPILLARY EXCHANGE SYSTEM OF SEMICONDUCTOR WIRE BONDING

CROSS-REFERENCE TO RELATED APPLICATIONS

This application claims the benefit of Korean Patent Application No. 10-2012-0020308, filed on Feb. 28, 2012, in the Korean Intellectual Property Office, the disclosure of which is incorporated herein in its entirety by reference.

BACKGROUND

Example embodiments of inventive concepts relate to capillary exchange devices and systems used in semiconductor wire bonding, for example, to capillary exchange devices and systems for automatically exchanging capillaries used in a semiconductor wire bonding.

Semiconductor wire bonding is included in a semiconductor package manufacturing process. In other words, a wire bonding is one of the processes which may be used in manufacturing a semiconductor package in which a semiconductor chip and a substrate are connected by using a gold wire (for example) to flow an electrical signal so that a semiconductor may have electrical properties.

A capillary used in wire bonding may be a micro-tube used for direct attachment of a gold wire along a trajectory of the gold wire. When wire bond equipment is compared to a sewing machine, it may be said that a capillary, a wire, and a semiconductor chip and a substrate correspond to a needle, thread, and cloth, respectively. Since the capillary is a consumable article having a limited useful lifetime, the capillary needs to be exchanged when the useful lifetime ends.

However, in a conventional capillary exchange process, wire bond equipment may be programmed to generate an alarm to call for a line worker when a certain amount of capillary has been used. In response to the alarm, the line worker may exchange an old capillary for a new capillary in the wire bond equipment that generated the alarm. In other words, conventionally, the line workers manually perform capillary exchange.

In an actual semiconductor packaging process field, the number of pieces of wire bonding equipment often amounts to several hundreds of units due to the characteristics of wire bonding. When a large number of capillaries is manually exchanged by line workers in a wire bonding process, the equipment is halted during the exchange of capillaries, which may lead deterioration in productivity.

Also, a capillary exchange time varies according to the skill level of line workers. In particular, a bond level variation is generated due to a capillary setting variation according to skill level of line workers, which may cause a setting quality defect.

SUMMARY

Example embodiments of inventive concepts provide a capillary exchange device or system for semiconductor wire bonding processes which may automatically exchange a capillary used in semiconductor wire bonding in order to reduce a worker's manual work time so that loss in time and costs for a capillary exchange process may be reduced. Also, capillary exchange time may be reduced so that the rate of operation of a semiconductor wire bonding equipment may be increased. Further, capillaries may be routinely and properly exchanged regardless of the skill level of line workers.

According to an example embodiment of inventive concepts, there is provided a capillary exchange system for use in semiconductor wire bonding which includes a wire bond unit having a chuck that includes a holding portion for holding a semiconductor wire bonding capillary, a holding release guide unit for mechanically acting on the chuck of the wire bond unit to allow the capillary to be held by the holding portion or released from the holding portion, and a capillary exchange unit for separating the capillary from the chuck of the wire bond unit and installing a new capillary in the chuck in cooperation with the holding release guide unit.

In example embodiments, the holding release guide unit may include a widening tool configured to be inserted into an insertion portion in the holding portion of the chuck in order to widen the holding portion.

In example embodiments, the chuck may include a pair of separation portions configured to separate from each other in order to widen the holding portion by the operation of the widening tool.

In example embodiments, the widening tool may be formed such that a first width in one direction is greater than a second width in the direction perpendicular to the direction of the first width to allow the capillary to be released from the holding portion by the rotation of the widening tool.

In example embodiments, the holding release guide unit may include a tool rotating portion configured to rotate the widening tool that is coupled to one end to the tool rotating portion, and a tool transfer portion coupled to the tool rotating portion and configured to transfer the widening tool to the insertion portion of the chuck and to insert the widening tool into the insertion portion of the chuck.

In example embodiments, the tool rotating portion may include a multi-joint link portion having the widening tool connected to one joint thereof and configured to rotate the widening tool, and a link driving portion configured to rotate the multi-joint link portion.

In example embodiments, the multi-joint link portion may include a base coupled to the tool transfer portion, a first rotation shaft and a second rotation shaft rotatably coupled to the base and separated from each other, a first rotation link and a second rotation link coupled to the first rotation shaft and the second rotation shaft, respectively, and a transfer link rotatably coupled to the first rotation link and to the second rotation link between the first rotation link and the second rotation link, wherein the widening tool is coupled to a the second rotation shaft.

In example embodiments, the link driving portion may include a rotation arm coupled to the first rotation shaft that is coupled to the base, a tool cylinder configured to provide a rotational force to the rotation arm, and a coupling member rotatably coupled to the rotation arm and to a rod of the tool cylinder, the coupling member may be between the rod and the rotation arm and configured to transfer a rotational force from the rod to the rotation arm.

In example embodiments, the tool transfer portion may include a tool moving portion configured to move the tool rotation portion to a position where the widening tool is inserted into the chuck, and a tool elevation portion coupled to the tool rotation portion and configured to elevate the tool rotation portion.

The capillary exchange unit may include a gripper module for gripping the capillary, and a gripper transfer module coupled to the gripper module where the gripper transfer module may be configured to transfer the gripper module to a position where the capillary is separated from or held by the chuck.

In example embodiments, the gripper module may include a grip main body, a gripping guide member capable of moving with respect to the grip main body, a pair of grip members forming a grip portion configured to grip the capillary, where the grip members may form a grip hole configured to accept the gripping guide member, and the pair of grip members may be configured to pivot with respect to a pivot shaft in the grip main body, and configured to allow the grip portion to be narrowed when the gripping guide member is inserted in the grip hole, and a pair of pressure springs provided in the grip main body configured to press end portions of the grip members at a side opposite to the grip portion.

In example embodiments, the gripper transfer module may include a gripper moving portion configured to transfer the gripper module to a position where the capillary is inserted, and a gripper elevation portion on the gripper moving portion configured to move the gripper module up and down.

In example embodiments, the gripper moving portion may include a transfer plate attached to the gripper module, a support plate attached to the linear guide and configured to support the transfer plate, a rack gear on the support plate, a pinion gear on the transfer plate and configured to engage the rack gear, and a transfer motor connected to the pinion gear.

In example embodiments, the capillary exchange system may further include a capillary supply portion at a side of the capillary exchange unit and having a plurality of capillaries arranged in a circumferential direction, and a rotation driving portion configured to rotate the capillary rotation plate.

In example embodiments, the capillary exchange system may further include a capillary supply block at a side of the capillary supply unit and having a plurality of capillaries arranged at an interval.

According to example embodiments of inventive concepts, there is a provided a capillary exchange device which includes a holding portion configured to hold a semiconductor wire bonding capillary, a holding release guide unit configured to release the capillary from the holding portion and a capillary exchange unit configured to separate the capillary from the holding portion, and to install a new capillary in the holding portion.

In example embodiments, the holding release guide unit may include a widening tool configured to be inserted into an insertion portion in the holding portion in order to widen the holding portion.

In example embodiments, the holding portion may include separation portions configured to separate from each other in order to widen the holding portion by operation of the widening tool.

In example embodiments, the capillary exchange device may include a capillary supply portion configured to hold a plurality of capillaries in a circumferential direction and a rotation driving portion configured to rotate a capillary rotation plate.

In example embodiments, the capillary exchange unit may include a gripper module configured to grip the capillary and a gripper transfer module coupled to the gripper module and configured to transfer the gripper module to a position where the capillary is separated from or held by the holding portion.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Example embodiments will now be described more fully with reference to the accompanying drawings. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements throughout, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The attached drawings for illustrating example embodiments of inventive concepts are referred to in order to gain a sufficient understanding of inventive concepts and the merits thereof. Hereinafter, inventive concepts will be described in detail by explaining embodiments of inventive concepts with reference to the attached drawings. Like reference numerals in the drawings denote like elements.

Figure 1:
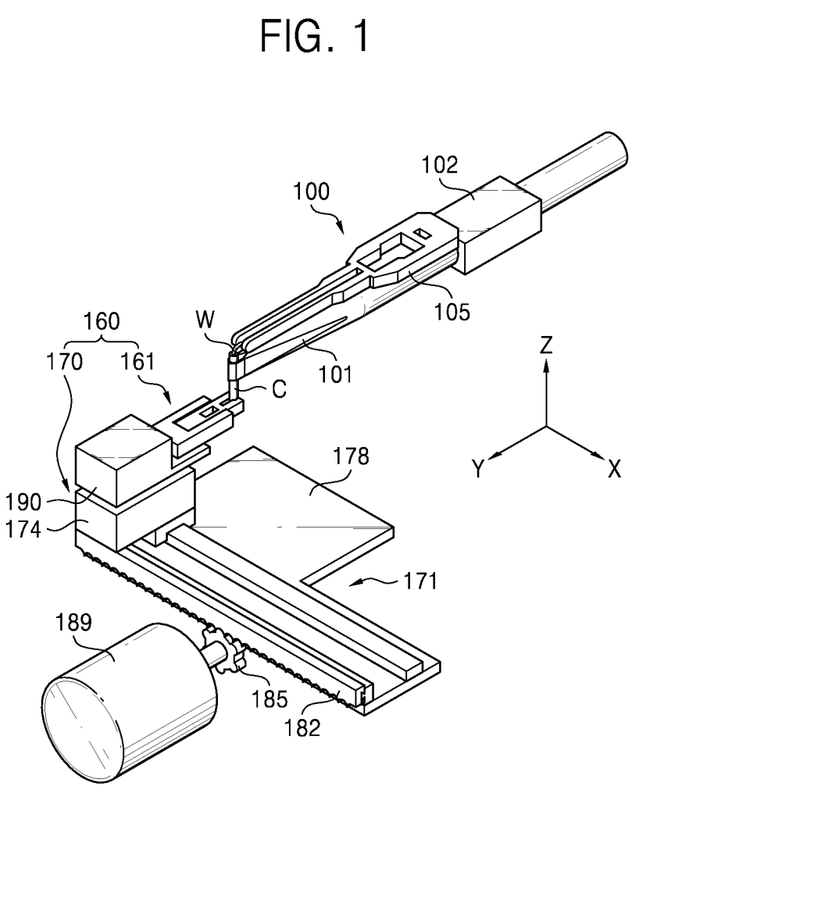
FIG. 1 is a conceptual perspective view of a capillary exchange system for semiconductor wire bonding according to example embodiments of inventive concepts.
Figure 2:
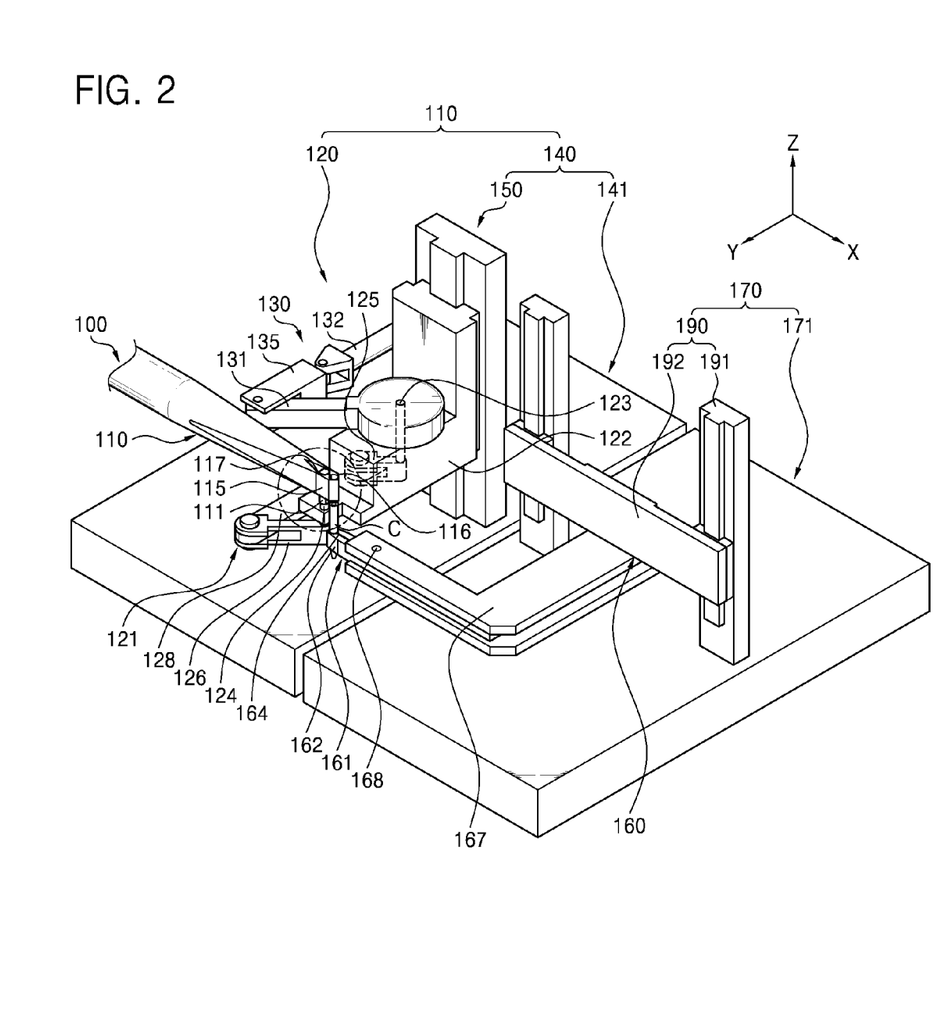
FIG. 2 is a schematic perspective view of a capillary exchange system for semiconductor wire bonding according to example embodiments of inventive concepts.
Figure 3:
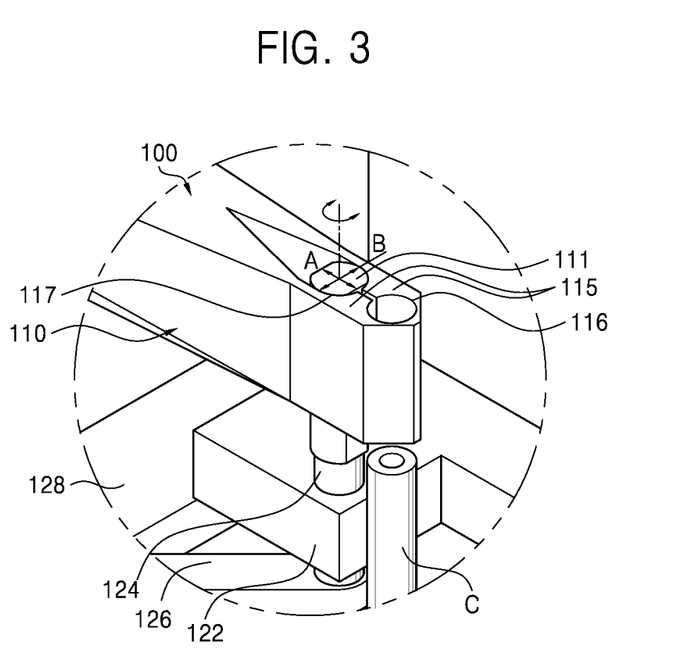
FIG. 3 is a magnified perspective view of an area C of FIG. 2.

FIG. 1 is a conceptual perspective view of a capillary exchange system for semiconductor wire bonding according to example embodiments of inventive concepts. FIG. 2 is a schematic perspective view of a capillary exchange system for semiconductor wire bonding according to an example embodiment of inventive concepts. FIG. 3 is a magnified perspective view of an area C of FIG. 2.

Referring to FIGS. 1 to 3, the capillary exchange system for semiconductor wire bonding according to example embodiments of inventive concepts includes a wire bond unit 100 having a chuck 101 that includes a holding portion 116 for holding a capillary C for semiconductor wire bonding, a holding release guide unit 110 for mechanically acting on the chuck 101 of the wire bond unit 100 to allow the capillary C to be held by the holding portion 116 or released from the holding portion 116, and a capillary exchange unit 160 for separating the capillary C from the chuck 101 of the wire bond unit 100 and installing a new capillary C in the chuck 101 in cooperation with the holding release guide unit 110.

The wire bond unit 100 includes the chuck 101, a transducer 102 having a built-in vibration device to vibrate the capillary C held by the chuck 101 and generating mechanical vibration when, for example, electric power is supplied to the vibration device and supplying the mechanical vibration to the chuck 101, and a wire guide 105 for guiding a wire W to the capillary C.

The chuck 101 and the transducer 102 may be coupled to each other to transfer vibration. The wire guide 105 may be arranged above the chuck 101. The wire guide 105 safely guides the wire W drawing from a wire supply portion (not shown) to an inner passage of the capillary C.

The holding release guide unit 110 may be arranged at a position to automatically approach the chuck 101 of the wire bond unit 100 and apply a mechanical force to the chuck 101 when the capillary C needs to be exchanged with respect to the wire bond unit 100. Then, the holding release guide unit 110 mechanically acts on the chuck 101 to allow the capillary C to be released from the chuck 101.

The capillary exchange unit 160 may be arranged at a position to perform an exchange of the capillary C with respect to the wire bond unit 100 at a side of the holding release guide unit 110. Accordingly, the capillary exchange unit 160 separates the capillary C from the chuck 101 and installs a new capillary C on the chuck 101 in cooperation with the holding release guide unit 110.

In other words, in example embodiments, the holding release guide unit 110 may mechanically act on the chuck 101 to make the capillary C separable from the chuck 101. Then, the capillary exchange unit 160 may separate the capillary C to be exchanged and take a new capillary C and couple the same to the chuck 101. When the holding release guide unit 110 is separated from the wire bond unit 100, the new capillary C may be stably held by the chuck 101.

As such, since a capillary used in a semiconductor wire bonding is automatically exchanged, a worker's manual work time is reduced and thus loss in time and costs for a capillary exchange process may be reduced. Also, since a capillary exchange time is reduced, the rate of operation of a semiconductor wire bonding may be increased. Further, capillaries may be routinely and properly exchanged regardless of the skill level of line workers. Example embodiments will be further described below in detail.

Referring to FIG. 3, the wire bond unit 100 includes the chuck 101 that widens when receiving a mechanical force from the holding release guide unit 110. The holding release guide unit 110 includes a widening tool 111 that is inserted in an insertion portion 117 of the chuck 101 to widen the holding portion 116 holding the capillary C.

The chuck 101 includes a pair of separation portions 115 that separate from each other to widen the holding portion 116 by the operation of the widening tool 111. When the separation portions 115 approach each other, the chuck 101 may hold the capillary C. When the separation portions 115 are separated from each other, the chuck 101 may release the capillary C from a held state. In example embodiments, the holding portion 116 is provided adjacent to the separation portions 115 and the insertion portion 117 is provided separated from the holding portion 116.

The insertion portion 117 and the widening tool 111 are provided to separate the separation portions 115 of the chuck 101 from each other. In detail, the insertion portion 117 is formed such that a width in a first direction is greater than the width in a second direction perpendicular to the first direction. As an example, the widening tool 111 may be formed such that a width A in the first direction is greater than a second width B in the direction perpendicular to the first direction A. The insertion portion 117 and the widening tool 111 may have shapes corresponding to each other. When the widening tool 111 inserted in the insertion portion 117 is rotated clockwise or counterclockwise, the separation portions 115 may be separated from each other so that the holding portion 116 is widened and thus the capillary C may be separated from the holding portion 116.

The holding release guide unit 110 of example embodiments locates the widening tool 111 at the insertion portion 117 of the chuck 101, inserts the widening tool 111 into the insertion portion 117, and rotates the widening tool 111 in the insertion portion 117. In other words, the holding release guide unit 110 includes a tool rotating portion 120 for rotating the widening tool 111 that is coupled to one end thereof, and a tool transfer portion 140 where the tool rotating portion 120 is located and for transferring the widening tool 111 to the insertion portion 117 of the chuck 101 and inserting the widening tool 111 into the insertion portion 117.

The tool rotating portion 120 includes a multi-joint link portion 121 having the widening tool 111 connected to one joint thereof and for rotating the widening tool 111, and a link driving portion 130 for rotating the multi-joint link portion 121.

The multi-joint link portion 121 includes a base 122 that may be moved by due to being coupled to the tool transfer portion 140, a first rotation shaft 123 and a second rotation shaft 124 rotatably coupled to the base 122 to be separated from each other, a first rotation link 125 and a second rotation link 126 respectively coupled to the first rotation shaft 123 and the second rotation shaft 124, and a transfer link 128 rotatably coupled to the first rotation link 125 and the second rotation link 126 between the first rotation link 125 and the second rotation link 126.

According to example embodiments, the multi-joint link portion 121 may be a four-joint link mechanism and includes the first rotation shaft 123 and the second rotation shaft 124 coupled to the base 122 with a gap therebetween, the first rotation link 125 coupled to the first rotation shaft 123, the second rotation link 126 coupled to the second rotation shaft 124, and the transfer link 128 for transferring a rotational motion according to rotation of the first rotation link 125 to the second rotation link 126. Accordingly, a rotational force of the first rotation shaft 123 is transferred to the second rotation shaft 124 via the transfer link 128.

In example embodiments, the widening tool 111 coupled to the second rotation shaft 124 may receive torque that is proportional to the length of the second rotation link 126 so that the widening tool 111 may be rotated in the insertion portion 117 of the separation portions 115 without undue difficulty. The widening tool 111 coupled to the second rotation shaft 124 may adopt a restriction structure to prevent free rotation with respect to the second rotation shaft 124 during rotation. As an example, a lower end portion of the widening tool 111 and the second rotation shaft 124 may be coupled like a torque wrench. Although in example embodiments the multi-joint link portion 121 is selected in order to rotate the widening tool 111, example embodiments of inventive concepts are not limited thereto and any structure capable of transferring a rotational force to the widening tool 111 may be employed.

Next, the link driving portion 130 may include a rotation arm 131 coupled to the first rotation shaft 123 that is coupled to the base 122, a tool cylinder (not shown) providing a rotational force to the rotation arm 131, and a coupling member 135 rotatably coupled to the rotation arm 131 and a rod 132 of the tool cylinder between the rod 132 and the rotation arm 131 and for transferring a rotational force from the rod 132 to the rotation arm 131. Although the structure of the tool cylinder is not illustrated in detail, a pneumatic cylinder that may provide a linear motion with respect to the coupling member 135 as much as a stroke of the rod 132 may be employed. In example embodiments, although a pneumatic cylinder is used to drive four-joint link, the scope of inventive concepts is not limited thereto and various driving mechanisms capable of providing a linear motion such as a ball screw may be employed.

The tool transfer portion 140 may include a tool moving portion 141 for moving the tool rotation portion 120 to the insertion portion 117 of the widening tool 111 with respect to the chuck 101 and a tool elevation portion 150 coupled to the tool rotation portion 120 and for elevating the tool rotation portion 120.

The widening tool 111 may be moved by the tool moving portion 141 along at least one axis of an X/Y plane to a position for insertion in the insertion portion 117 of the chuck 101. The tool elevation portion 150 may be inserted into the insertion portion 117 by ascending the widening tool 111 along a Z-axis.

Although the tool moving portion 141 is not described in detail, a variety of driving mechanisms such as a combination of a rack gear and a pinion gear or a ball screw method to transfer the tool rotation portion 120 may be used.

According to the above configuration of the holding release guide unit 110, as the widening tool 111 of the holding release guide unit 110 is inserted into the insertion portion 117 and rotated, the separation portions 115 are separated from each other due to a mechanical force and thus the holding portion 116 of the chuck 101 may widen. Accordingly, as the holding portion 116 is widened, the capillary C may be released from the holding portion 116. When the capillary C is released from the holding portion 116, the capillary C may be separated and thus exchanged. The capillary exchange unit 160 exchanges the capillary C in cooperation with the holding release guide unit 110.

Figure 4:
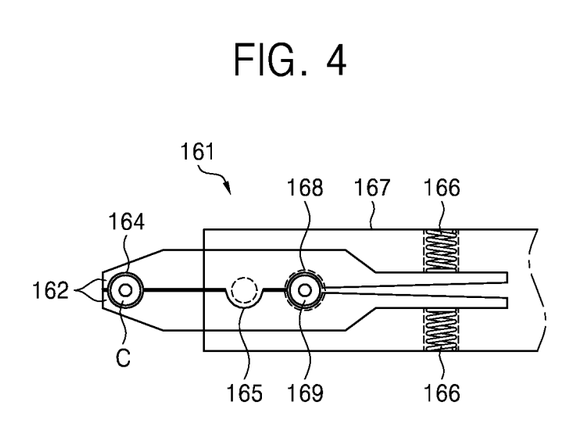
FIG. 4 is a schematic bottom side view of a gripper module of FIG. 2.
Figure 5:
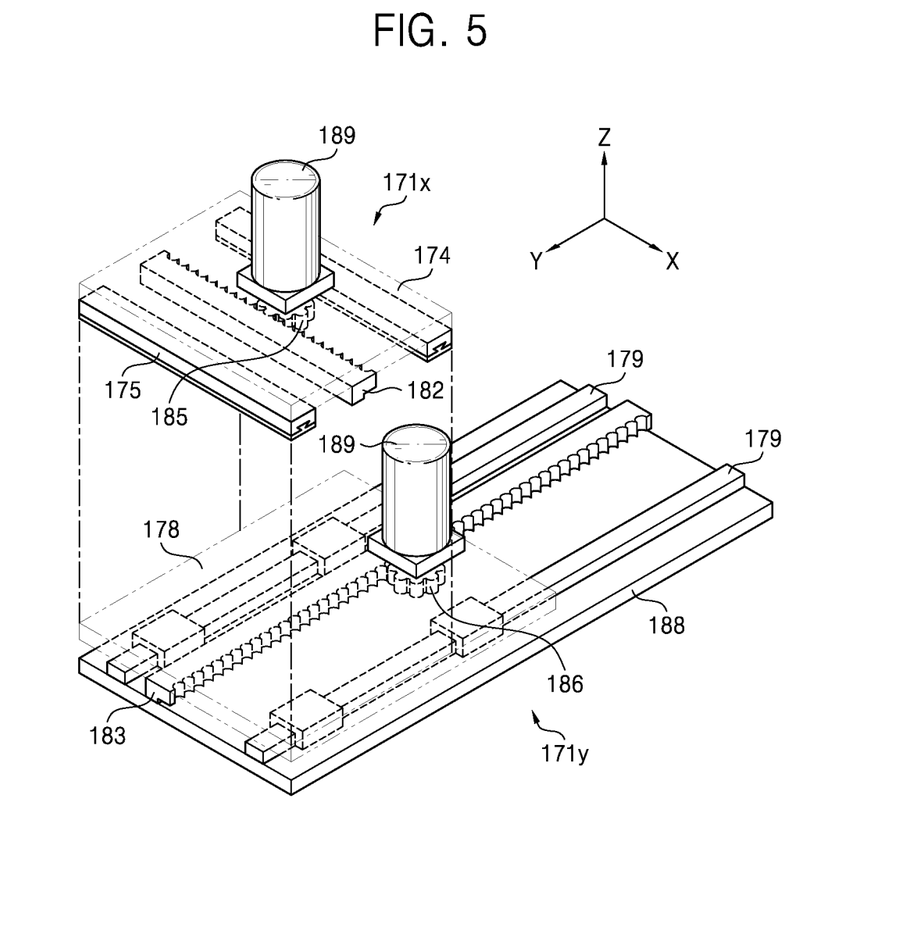
FIG. 5 is a conceptual perspective view of a tool transfer portion of FIG. 2.

FIG. 4 is a schematic bottom side view of a gripper module of FIG. 2. FIG. 5 is a conceptual perspective view of a tool transfer portion of FIG. 2.

Referring to FIGS. 1, 2, 4, and 5, the capillary exchange unit 160 includes a gripper module 161 for gripping the capillary C, and a gripper transfer module 170 for transferring the gripper module 161 to a position where the capillary C is separated from or held by the chuck 101 when the gripper module 161 is coupled thereto.

First, referring to FIGS. 2 and 4, the gripper module 161, according to example embodiments, includes a grip main body 167, a gripping guide member 169 provided capable of relatively moving with respect to the grip main body 167, a pair of grip members 162 forming a grip portion 164 for gripping the capillary C and a grip hole 168 into which the gripping guide member 169 is inserted, provided capable of relatively pivoting with respect to a pivot shaft 165 that is provided in the grip main body 167, and allowing the grip portion 164 to be narrowed when the gripping guide member 169 is inserted in the grip hole 168, and a pair of pressure springs 166 provided in the grip main body 167 to press end portions of the grip members 162 at a side opposite to the grip portion 164.

The gripper module 161 is transferred by the gripper transfer module 170 to the position where the capillary C is separated from and held by the holding portion 116 of the chuck 101. When the holding release guide unit 110 widens the holding portion 116, the gripper module 161 grips the capillary C for separation and disposes the capillary to a capillary supply portion (not shown) that will be described later. Then, the gripper module 161 grips a new capillary C from the capillary supply portion and the new capillary C is transferred by the gripper transfer module 170 to the holding portion 116. Then, the gripper module 161 installs the capillary C at the holding portion 116. When the holding release guide unit 110 narrows the holding portion 116 again, the capillary C is stably held by the holding portion 116.

The grip members 162 for gripping the capillary C, may grip or release the capillary C by pivoting around the pivot shaft 165. In other words, when the gripping guide member 169 is separated from the grip hole 168, the grip portion 164 is widened by the pressing springs 166. When the grip portion 164 is widened, the grip members 162 may release the capillary C from the grip portion 164 or install the capillary C in the grip portion 164. When the gripping guide member 169 is inserted in the grip hole 168 of the grip main body 167, as shown in FIG. 4, the grip portion 164 is narrowed again so as to grip the capillary C.

Referring to FIGS. 1, 2, and 5, the gripper transfer module 170 includes a gripper moving portion 171 for moving the gripper module 161 to a position where the capillary C is separated or held, and a gripper elevation portion 190 arranged on the gripper moving portion 171 and moving the gripper module 161 up and down.

In example embodiments, the gripper moving portion 171 includes a gripper X-axis transfer portion 171x and a gripper Y-axis transfer portion 171y. In example embodiments, the gripper X-axis transfer portion 171x is arranged on the gripper Y-axis transfer portion 171y.

First, the gripper X-axis transfer portion 171x includes a first transfer plate 174 to which the gripper module 161 is coupled, a first support plate 178 to which a linear guide 175 supporting the first transfer plate 174 is coupled, a first rack gear 182 provided on the first support plate 178, a first pinion gear 185 coupled to the first transfer plate 174 and engaged with the first rack gear 182, and a transfer motor 189 connected to the first pinion gear 185.

Next, the gripper Y-axis transfer portion 171y includes a second transfer plate 178 also functioning as the first support plate 178 of the gripper X-axis transfer portion 171x, a second support plate 188 to which a linear guide 179 supporting the second transfer plate 178 is coupled, a second rack gear 183 provided on the second support plate 188, a second pinion gear 186 coupled to the second transfer plate 178 and engaged with the second rack gear 183, and a transfer motor 189 connected to the second pinion gear 186.

In the above configuration, the whole of the gripper X-axis transfer portion 171x is arranged on the gripper Y-axis transfer portion 171y and moved along the Y axis so that the gripper module 161 is moved along the Y axis. However, the scope of the present inventive concepts is not limited thereto and any structure capable of transferring the gripper module 161 to a position where the capillary C is separated or held may be provided as the gripper moving portion 171.

The gripper elevation portion 190 corresponding to a Z-axis driving portion may include a vertical linear guide 191, a horizontal frame 192 elevating along the vertical linear guide 191, and an elevation driving portion (not shown) providing an elevation driving force to the horizontal frame 192. As illustrated in detail in FIG. 2, the grip main body 167 is coupled to the horizontal frame 192 and moved up and down along the vertical linear guide 191.

Figure 6:
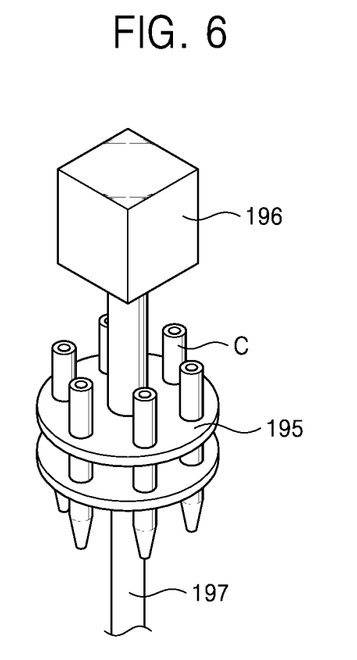
FIG. 6 is a perspective view of a capillary supply portion for supplying a capillary to a capillary exchange unit of FIG. 2.
Figure 7:
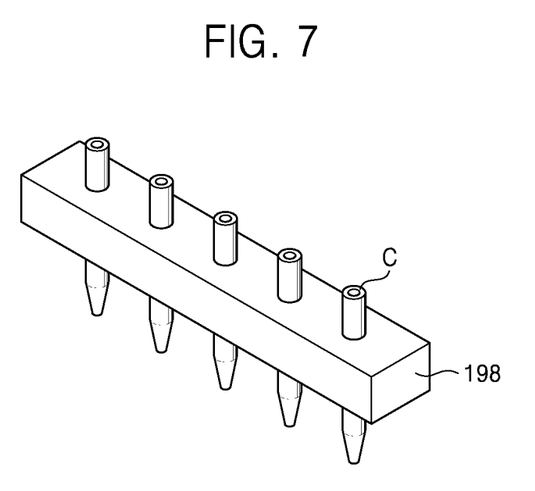
FIG. 7 is a perspective view of a capillary supply portion according to another example embodiment of the present inventive concepts.

FIG. 6 is a perspective view of a capillary supply portion for supplying a capillary to the capillary exchange unit 160 of FIG. 2. FIG. 7 is a perspective view of a capillary supply portion according to another example embodiment of the inventive concepts.

Referring to FIGS. 2 and 6, a capillary supply portion (not shown) is arranged at a side of the capillary exchange unit 160 and includes a capillary rotation plate 195 and a rotation driving portion 196 for rotating the capillary rotation plate 195. A plurality of capillaries C are arranged in the capillary rotation plate 195 in a circumferential direction and the capillary rotation plate 195 is coupled to a shaft 197. According to the above structure, the grip members 162 of the gripper module 161 approach the capillary rotation plate 195 to insert an old capillary and then the capillary rotation plate 195 is rotated to facilitate gripping of a new capillary.

Referring to FIG. 7, a capillary supply portion according to another example embodiment includes a capillary supply block 198 arranged at a side of the capillary exchange unit 160. A plurality of capillaries C are linearly arranged at an interval in the capillary supply block 198. The gripper module 161 may approach the capillary supply block 198 and grip a capillary C.

As described above, according example embodiments of inventive concepts, a worker's manual work time may be reduced by automatically exchanging a capillary used in a semiconductor wire bonding process so that loss in time and costs for a capillary exchange process may be reduced. Also, since a capillary exchange time may be reduced, the rate of operation of a semiconductor wire bonding may be increased. Further, capillaries may be routinely and properly exchanged regardless of the skill level of line workers.

While example embodiments have been particularly shown and described, it will be understood by one of ordinary skill in the art that that various changes in form and details may be made therein without departing from the spirit and scope of the following claims.

What is claimed is:

1. A capillary exchange system for use in semiconductor wire bonding, the capillary exchange system comprising:
  a wire bond unit having a chuck that includes a holding portion configured to hold a semiconductor wire bonding capillary;
  a holding release guide unit configured to mechanically act on the chuck of the wire bond unit to allow the capillary to be held by the holding portion or to be released from the holding portion; and
  a capillary exchange unit configured to separate the capillary from the chuck of the wire bond unit, the capillary exchange unit further configured to install a new capillary in the chuck in cooperation with the holding release guide unit
  wherein the holding release guide unit includes a widening tool configured to be inserted into an insertion portion in the holding portion of the chuck in order to widen the holding portion,
  the holding release guide unit includes:
    a tool rotating portion configured to rotate the widening tool, the widening tool being coupled to one end of the tool rotating portion; and
    a tool transfer portion coupled to the tool rotating portion, the tool transfer portion configured to transfer the widening tool to the insertion portion of the chuck and to insert the widening tool into the insertion portion of the chuck,
wherein the tool rotating portion includes:
a multi-joint link portion having the widening tool connected to one joint thereof and the a multi-joint link configured to rotate the widening tool; and
a link driving portion configured to rotate the multi-joint link portion.

2. The capillary exchange system of claim 1, wherein the chuck includes a pair of separation portions configured to separate from each other in order to widen the holding portion by operation of the widening tool.

3. The capillary exchange system of claim 2, wherein the widening tool has a first width in one direction greater than a second width in the direction perpendicular to the direction of the first width to allow the capillary to be released from the holding portion by the rotation of the widening tool.

4. The capillary exchange system of claim 1, wherein the multi joint link portion comprises:
a base coupled to the tool transfer portion;
a first rotation shaft and a second rotation shaft rotatably coupled to the base, the first and second rotation shafts being separated from each other;
a first rotation link and a second rotation link coupled to the first rotation shaft and the second rotation shaft, respectively; and
a transfer link rotatably coupled to the first rotation link and to the second rotation link, the transfer link being between the first rotation link and the second rotation link,
wherein the widening tool is coupled to the second rotation shaft.

5. The capillary exchange system of claim 4, wherein the link driving portion comprises:
a rotation arm coupled to the first rotation shaft, the first rotation shaft being coupled to the base;
a tool cylinder configured to provide a rotational force to the rotation arm; and
a coupling member rotatably coupled to the rotation arm and coupled to a rod of the tool cylinder, the coupling member being between the rod and the rotation arm and configured to transfer a rotational force from the rod to the rotation arm.

6. The capillary exchange system of claim 1, wherein the tool transfer portion comprise:
a tool moving portion configured to move the tool rotation portion to a position where the widening tool is inserted into the chuck; and
a tool elevation portion coupled to the tool rotation portion, the tool elevation portion configured to elevate the tool rotation portion.

7. The capillary exchange system of claim 1, wherein the capillary exchange unit comprises:
a gripper module configured to grip the capillary; and
a gripper transfer module coupled to the gripper module, the gripper transfer module configured to transfer the gripper module to a position where the capillary is separated from or held by the chuck.

8. The capillary exchange system of claim 7, wherein the gripper module comprises:
a grip main body;
a gripping guide member capable of moving with respect to the grip main body;
a pair of grip members forming a grip portion configured to grip the capillary, the pair of grip members further forming a grip hole, the grip hole configured to accept the gripping guide member, the pair of grip members configured to pivot with respect to a pivot shaft in the grip main body, and the pair of grip members configured to allow the grip portion to be narrowed when the gripping guide member is inserted in the grip hole; and
a pair of pressure springs provided in the grip main body configured to press end portions of the grip members at a side opposite to the grip portion.

9. The capillary exchange system of claim 7, wherein the gripper transfer module comprises:
a gripper moving portion configured to transfer the gripper module to a position where the capillary is inserted; and
a gripper elevation portion on the gripper moving portion, the gripper elevation portion configured to move the gripper module up and down.

10. The capillary exchange system of claim 9, wherein the gripper moving portion comprises:
a transfer plate attached to the gripper module;
a support plate attached to a linear guide, the linear guide configured to support the transfer plate;
a rack gear on the support plate;
a pinion gear on the transfer plate, the pinion gear configured to engage the rack gear; and
a transfer motor connected to the pinion gear.

11. The capillary exchange system of claim 1, further comprising:
a capillary supply portion at a side of the capillary exchange unit, the capillary supply portion having a plurality of capillaries arranged in a circumferential direction; and
a rotation driving portion configured to rotate a capillary rotation plate.

12. The capillary exchange system of claim 1, further comprising a capillary supply block at a side of the capillary supply unit and having a plurality of capillaries arranged at an interval.

13. A capillary exchange device comprising:
a holding portion configured to hold a semiconductor wire bonding capillary;
a holding release guide unit configured to release the capillary from the holding portion; and
a capillary exchange unit configured to separate the capillary from the holding portion, the capillary exchange unit further configured to install a new capillary in the holding portion,
wherein the holding release guide unit includes a widening tool configured to be inserted into an insertion portion in the holding portion of the chuck in order to widen the holding portion,
the holding release guide unit includes:
a tool rotating portion configured to rotate the widening tool, the widening tool being coupled to one end of the tool rotating portion; and
a tool transfer portion coupled to the tool rotating portion, the tool transfer portion configured to transfer the widening tool to the insertion portion of the chuck and to insert the widening tool into the insertion portion of the chuck,
wherein the tool rotating portion includes:
a multi-joint link portion having the widening tool connected to one joint thereof and the a multi-joint link configured to rotate the widening tool; and
a link driving portion configured to rotate the multi-joint link portion.

14. The capillary exchange device of claim 13, wherein the holding release guide unit comprises a widening tool configured to be inserted in an insertion portion in the holding portion in order to widen the holding portion.

15. The capillary exchange device of claim 14, wherein the holding portion includes separation portions configured to separate from each other in order to widen the holding portion by operation of the widening tool.

16. The capillary exchange device of claim 13, further comprising:
   a capillary supply portion configured to hold a plurality of capillaries in a circumferential direction; and
   a rotation driving portion configured to rotate a capillary rotation plate.

17. The capillary exchange device of claim 13, wherein the capillary exchange unit comprises:
   a gripper module configured to grip the capillary; and
   a gripper transfer module coupled to the gripper module, the gripper transfer module configured to transfer the gripper module to a position where the capillary is separated from or held by the holding portion.

* * * * *